(12) United States Patent
Wang et al.

(10) Patent No.: US 9,413,297 B2
(45) Date of Patent: Aug. 9, 2016

(54) CONSTANT TRANSCONDUCTANCE BIAS CIRCUIT

(71) Applicant: National Chiao Tung University, Hsinchu (TW)

(72) Inventors: Yu-Jiu Wang, Taichung (TW); Ching-Yun Chu, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/640,960

(22) Filed: Mar. 6, 2015

(65) Prior Publication Data
US 2015/0256131 A1  Sep. 10, 2015

Related U.S. Application Data

(60) Provisional application No. 61/950,122, filed on Mar. 9, 2014.

(51) Int. Cl.
*H03F 3/04* (2006.01)
*H03F 1/02* (2006.01)
*H03F 3/16* (2006.01)
(Continued)

(52) U.S. Cl.
CPC .............. *H03F 1/0205* (2013.01); *G05F 3/242* (2013.01); *H03F 1/0261* (2013.01); *H03F 1/301* (2013.01); *H03F 3/16* (2013.01); *H03F 2200/24* (2013.01); *H03F 2200/555* (2013.01); *H03F 2203/45136* (2013.01); *H03F 2203/45528* (2013.01)

(58) Field of Classification Search
CPC ................ H03F 3/04; H03F 3/20; H03G 3/30
USPC .................................................. 330/296, 285
See application file for complete search history.

(56) References Cited

U.S. PATENT DOCUMENTS

| | | | |
|---|---|---|---|
| 6,194,967 B1 * | 2/2001 | Johnson | G05F 3/262 323/315 |
| 6,407,623 B1 | 6/2002 | Bazarjani et al. | |
| 7,759,983 B2 * | 7/2010 | Carrara | G01R 19/04 327/50 |

(Continued)

FOREIGN PATENT DOCUMENTS

EP     2784934 A1    10/2014

OTHER PUBLICATIONS

J. Chen and B. Shi, "Novel Constant Transconductance References and the Comparisons with the Traditional Approach," in Mixed-Signal Design, 2003. Southwest Symposium on Feb. 25. 2003: pp. 104-107.

(Continued)

*Primary Examiner* — Henry Choe
(74) *Attorney, Agent, or Firm* — DLA Piper LLP (US)

(57) ABSTRACT

A bias circuit is adapted for biasing a to-be-biased transconductance cell such that the to-be-biased transconductance cell has a constant transconductance, and includes a converter and a controller. The converter receives first and second current signals, and generates, based on the first and second current signals, a first voltage signal, a second voltage signal and a bias voltage that is for biasing the to-be-biased transconductance cell. The controller receives the first and second voltage signals from the converter, generates the first and second current signals for the converter based on the first and second voltage signals so as to make a magnitude of the first voltage signal equal a magnitude of the second voltage signal.

9 Claims, 11 Drawing Sheets

(51) Int. Cl.
*H03F 1/30* (2006.01)
*G05F 3/24* (2006.01)

(56) References Cited

U.S. PATENT DOCUMENTS

| | | | |
|---|---|---|---|
| 8,183,914 B2 | 5/2012 | Tsai et al. | |
| 8,489,052 B2* | 7/2013 | Bult | H03F 3/195 330/254 |
| 8,699,534 B2* | 4/2014 | Dean | G11B 7/00456 369/116 |
| 9,130,509 B2* | 9/2015 | Xu | G01S 19/21 |

OTHER PUBLICATIONS

V. Agarwal and S. Sonkusale, "A PVT Independent Subthreshold Constant-Gm Stage for very Low Frequency Applications," in Circuits and Systems, 2008. ISCAS 2008. IEEE International Symposium on May 18-21, 2008: pp. 2909-2912.

N. Talebbeydokhti et al:, "Constant Transconductance Bias Circuit with an On-Chip Resistor," in Circuits and Systems, 2006. ISCAS 2006. Proceedings. 2006 IEEE International Symposium on May 21-24, 2006: pp. 2857-2860.

* cited by examiner

CONSTANT TRANSCONDUCTANCE BIAS CIRCUIT

CROSS-REFERENCE TO RELATED APPLICATION

This application claims priority of U.S. Provisional Application No. 61/950,122, filed on Mar. 9, 2014.

FIELD

This disclosure relates to a bias circuit, and more particularly to a constant transconductance bias circuit.

BACKGROUND

A conventional constant transconductance bias circuit generates a bias voltage for biasing a to-be-biased transconductance cell such that the to-be-biased transconductance cell has a constant transconductance. However, the conventional constant transconductance bias circuit may fail to operate properly when each internal transconductance cell thereof has a voltage to current transfer function failing to follow a presumed law (e.g., a square law).

SUMMARY

Therefore, an object of this disclosure is to provide a bias circuit that can alleviate the drawback of the prior art.

According to one aspect of this disclosure, there is provided a bias circuit adapted for biasing a to-be-biased transconductance cell to have a constant transconductance. The bias circuit includes a converter and a controller.

The converter receives a first current signal and a second current signal, and generates, based on the first and second current signals, a first voltage signal, a second voltage signal and a bias voltage that is for biasing the to-be-biased transconductance cell, in which:

$I2 = N \times I1$, $V1 = T^{-2}(I1 - \Delta Iin + B) + A$, $V2 = T^{-1}[(1/N) \times (I2 + N \times B)] - \Delta Iin \times R + A$, and $Vb = \{Vm + \Delta Iin \times R \times K \text{ or } Vm - \Delta Iin \times R \times K\}$, where I1 and I2 respectively denote magnitudes of the first and second current signals, V1 and V2 respectively denote magnitudes of the first and second voltage signals, Vb denotes a magnitude of the bias voltage, $T^{-1}(\cdot)$ denotes a current to voltage inverse transfer function associated with the to-be-biased transconductance cell, ΔIin denotes a magnitude of a reference current signal which is predetermined, B denotes a predetermined current value, A denotes a predetermined voltage value, N denotes a predetermined constant greater than zero, R denotes a predetermined resistance value, m=(1 or 2), and K denotes a predetermined constant greater than zero and smaller than one.

The controller is coupled to the converter, receives the first and second voltage signals from the converter, and generates the first and second current signals for the converter based on the first and second voltage signals so as to make the magnitude of the first voltage signal equal the magnitude or the second voltage signal.

According to another aspect of this disclosure, there is provided a bias circuit adapted for biasing a to-be-biased transconductance cell to have a constant transconductance. The bias circuit includes a converter and a controller.

The converter receives a voltage signal, and generates, based on the voltage signal, a first current signal, a second current signal and a bias voltage that is for biasing the to-be-biased transconductance cell, in which:

$I1 = T(V0 + \Delta Iin \times R + A) + B$, $I2 = N \times T(V0 + A) + N \times \Delta Iin + N \times B$, and $Vb = \{V0 + \Delta Iin \times R \times K \text{ or } V0 - \Delta Iin \times R \times K\}$, where V0 denotes a magnitude of the voltage signal, I1 and I2 respectively denote magnitudes of the first and second current signals, Vb denotes a magnitude of the bias voltage, $T(\cdot)$ denotes a voltage to current transfer function associated with the to-be-biased transconductance cell, ΔIin denotes a magnitude of a reference current signal which is predetermined, A denotes a predetermined voltage value, B denotes a predetermined current value, N denotes a predetermined constant greater than zero, R denotes a predetermined resistance value, and K denotes a predetermined constant greater than zero and smaller than one.

The controller is coupled to the converter, receives the first and second current signals from the converter, and generates the voltage signal for the converter based on the first and second current signals so as to make the magnitude of the first current signal equal 1/N times the magnitude of the second current signal.

BRIEF DESCRIPTION OF THE DRAWINGS

Other features and advantages of this disclosure will become apparent in the following detailed description of the embodiment(s) with reference to the accompanying drawings, of which.

DETAILED DESCRIPTION

Figure 1:
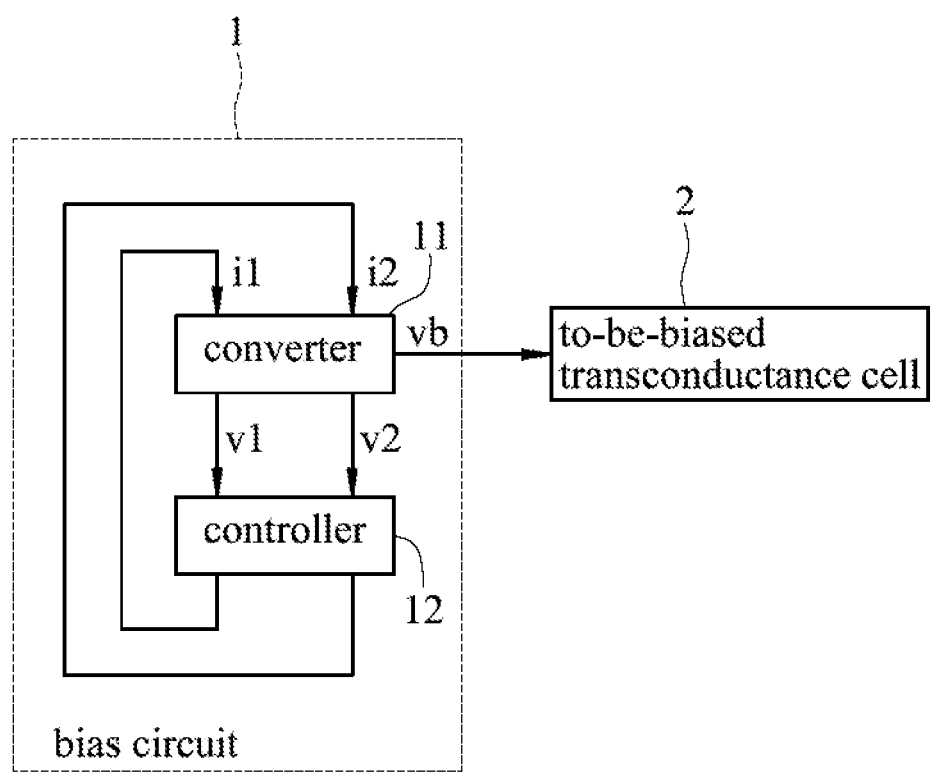
FIG. 1 is a schematic block diagram illustrating a first embodiment of a bias circuit according to this disclosure.

Before this disclosure is described in greater detail, it should be noted that like elements are denoted by the same reference numerals throughout this disclosure.

Referring to FIG. 1, a first embodiment of a bias circuit 1 according to this disclosure is adapted for biasing a to-be-biased transconductance cell 2 such that the to-be-biased transconductance cell 2 has a constant transconductance. The to-be-biased transconductance cell 2 has a voltage to current transfer function of P×T(·), where P is a predetermined constant greater than zero (i.e., P>0) and T(·) is smooth and monotonic (e.g., monotonically increasing or monotonically decreasing). As an example, the to-be-biased transconductance cell 2 may be an N-channel metal oxide semiconductor field effect transistor (MOSFET), and P is associated with a width to length ratio thereof. The bias circuit 1 includes a converter 11 and a controller 12.

The converter 11 receives a first current signal (i1) and a second current signal (i2), and generates, based on the first and second current signals (i1, i2), a first voltage signal (v1), a second voltage signal (v2) and a bias voltage (vb) that is for biasing the to-be-biased transconductance cell 2.

In this embodiment, the converter 11 may be designed according to predetermined relationships among the first and second current signals (i1, i2), the first and second voltage signals (v1, v2) and the bias voltage (vb), as can be expressed by the following equations:

$$I2 = N \times I1, \qquad \text{Equation 1}$$

$$V1 = T^{-1}(I1 - \Delta Iin + B) + A, \qquad \text{Equation 2}$$

$$V2 = T^{-1}[(1/N) \times (I2 + N \times B)] - \Delta Iin \times R + A, \qquad \text{Equation 3}$$

$$Vb = \{Vm + \Delta Iin \times R \times K \text{ or } Vm - \Delta Iin \times R \times K\}, \qquad \text{Equation 4}$$

where "I1" and "I2" respectively denote magnitudes of the first and second current signals (i1, i2), "V1" and "V2" respectively denote magnitudes of the first and second voltage signals (v1, v2), "Vb" denotes a magnitude of the bias voltage (vb), "$T^{-1}(\cdot)$" denotes a current to voltage inverse transfer function associated with the to-be-biased transconductance cell 2 (i.e., $T^{-1}(\cdot)$ is an inverse of T(·)), "$\Delta Iin$" denotes a magnitude of a predetermined reference current signal ($\Delta iin$) (see FIG. 2), "B" denotes a predetermined current value, "A" denotes a predetermined voltage value, "N" denotes a predetermined constant greater than zero (i.e., N>0), "R" denotes a predetermined resistance value, m=(1 or 2), and "K" denotes a predetermined constant greater than zero and smaller than one (i.e., 0<K<1). Details of these parameters may be described in the following implementations. Preferably, the reference current signal ($\Delta iin$) (see FIG. 2) is constant, and the magnitude thereof is determined based on an expected swing of an output current of the to-be-biased transconductance cell 2 (i.e., the magnitude is proportional to the expected swing).

The controller 12 is coupled to the converter 11, receives the first and second voltage signals (v1, v2) from the converter 11, and generates the first and second current signals (i1, i2) for the converter 11 based on the first and second voltage signals (v1, v2) so as to make the magnitude of the first voltage signal (v1) equal the magnitude of the second voltage signal (v2) (i.e., V1=V2).

Equation 2 can be rearranged as I1−$\Delta Iin$+B=T(V1−A). Since I2=N×I1 and V2=V1, Equation 3 can be rearranged as I1+B=T(V1+$\Delta Iin$×R−A). Regardless of whether a first order derivative of T(·) is monotonically increasing or monotonically decreasing, the large signal transconductance of the to-be-biased transconductance cell 2 is independent of a fabrication process, a power supply voltage and a temperature associated with the bias circuit 1 and the to-be-biased transconductance cell 2, and equals P×[(I1+B)−(I1−$\Delta Iin$+B)]/[(V1+$\Delta Iin$×R−A)−(V1−A)]P/R. Besides, K is configured to minimize the dependence of the small signal transconductance of the to-be-biased transconductance cell 2 on the fabrication process, the power supply voltage and the temperature.

Figure 2:
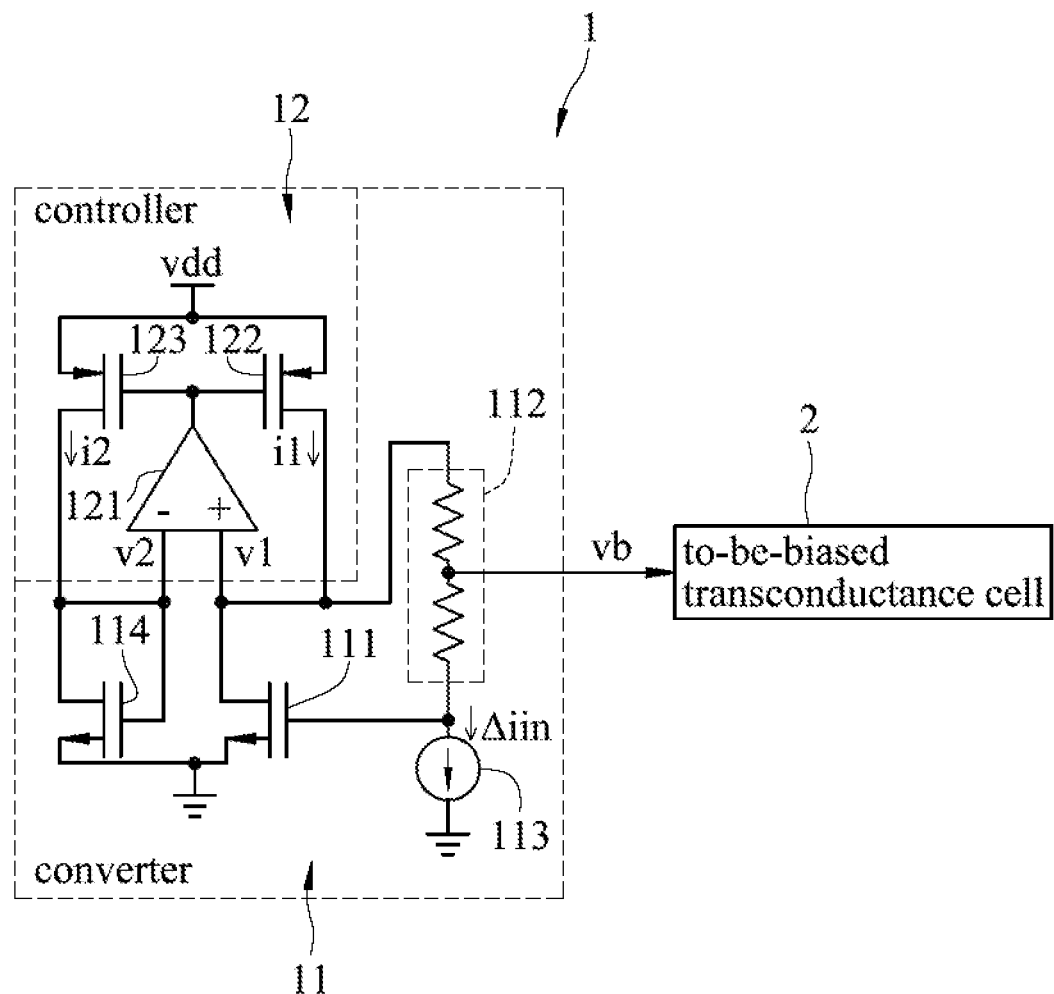
FIG. 2 is a schematic circuit block diagram illustrating a first exemplary implementation of the first embodiment.

FIG. 2 illustrates a first exemplary implementation of the bias circuit 1. In the first exemplary implementation, each of the first, second and reference current signals (i1, i2, $\Delta iin$) is an analog current signal, and each of the first and second voltage signals (v1, v2) is an analog voltage signal.

In addition, the controller 12 includes an amplifier 121, a first transconductance cell 122 and a second transconductance cell 123.

The amplifier 121 has a first input terminal and a second input terminal that are coupled to the converter 11 for respectively receiving the first and second voltage signals (v1, v2) therefrom, and an output terminal. The amplifier 121 generates a control voltage based on the first and second voltage signals (v1, v2), and outputs the control voltage at the output terminal thereof.

The first transconductance cell 122 has a first terminal coupled to the output terminal of the amplifier 121 for receiving the control voltage therefrom, and a second terminal coupled to the converter 11. The first transconductance cell 122 converts the control voltage into the first current signal (i1), and outputs the first current signal (i1) at the second terminal thereof.

The second transconductance cell 123 has a first terminal coupled to the output terminal of the amplifier 121 for receiving the control voltage therefrom, and a second terminal coupled to the converter 11. The second transconductance cell 123 converts the control voltage into the second current signal (i2), and outputs the second current signal (i2) at the second terminal thereof. The second transconductance cell 123 has a transconductance N times that of the first transconductance cell 122, so as to make the magnitude of the second current signal (i2) equal N times the magnitude of the first current signal (i1) (i.e., I2=N×I1).

In this implementation, each of the first and second transconductance cells 122, 123 is, for example, a P-channel MOSFET that has a gate terminal serving as the first terminal, a drain terminal serving as the second terminal, and a source terminal coupled to a reference node, to which the power supply voltage (vdd) is supplied. The second transconductance cell 123 has a width to length ratio N times that of the first transconductance cell 122.

In this implementation, values of B, A and Vb are designed as B=0, A=$\Delta Iin$×R, Vb=V1−$\Delta Iin$×R×K, so that Equation 2 becomes V1=$T^{-2}$ (I1−$\Delta Iin$)+$\Delta Iin$×R, and Equation 3 becomes V2=$T^{-1}$[(1/N)×I2]. The converter 11 is configured according to the Equations 2 and 3, and includes a third transconductance cell 111, a resistor string 112, a current source 113 and a fourth transconductance cell 114.

The third transconductance cell 111 has a first terminal, and a second terminal that is coupled to the first input terminal of the amplifier 121 of the controller 12 and the second terminal of the first transconductance cell 122 of the controller 12. The third transconductance cell 111 has a voltage to current transfer function of T(·) from the first terminal thereof to the second terminal thereof.

The resistor string 112 has a first end terminal that is coupled to the second terminal of the third transconductance cell 111, a second end terminal that is coupled to the first terminal of the third transconductance cell 111, and an intermediate terminal that provides the bias voltage (vb). The resistor string 112 has a resistance of R between the first and second end terminals thereof, and a resistance of K×R between the first end and intermediate terminals thereof.

The current source 113 is coupled to the first terminal of the third transconductance cell 111, and provides the reference current signal (Δiin) that flows through the resistor string 112 and that constitutes a portion of the first current signal (i1).

The fourth transconductance cell 114 has a first terminal, and a second terminal that is coupled to the first terminal of the fourth transconductance cell 114, the second input terminal of the amplifier 121 of the controller 12 and the second terminal of the second transconductance cell 123 of the controller 12. The fourth transconductance cell 114 has a voltage to current transfer function of N×T(·) from the first terminal thereof to the second terminal thereof.

In this implementation, each of the third and fourth transconductance cells 111, 114 is, for example, an N-channel MOSFET that has a gate terminal serving as the first terminal, a drain terminal serving as the second terminal, and a grounded source terminal. The fourth transconductance cell 114 has a width to length ratio N times that of the third transconductance cell 111. The to-be-biased transconductance cell 2 has the width to length ratio P times that of the third transconductance cell 111. It is noted that the third, fourth and to-be-biased transconductance cells 111, 114, 2 may all operate in a saturation region or a sub-threshold region.

In operation, the first current signal (i1) is divided into the reference current signal (Δiin) that flows through the resistor string 112, and a current that has a magnitude of I1−ΔIin and that flows through the third transconductance cell 111. The third transconductance cell 111 forces a voltage at the second end terminal of the resistor string 112 to have a magnitude of $T^{-2}$ (I1−ΔIin). The resistor string 112 and the current source 113 cooperatively force the first voltage signal (v1) and the bias voltage (vb) to respectively have the magnitude of $V1=T^{-1}$ (I1−ΔIin)+ΔIin×R and the magnitude of Vb=V1−ΔIin×R×K. Besides, the second current signal (i2) flows through the fourth transconductance cell 114. The fourth transconductance cell 114 forces the second voltage signal (v2) to have the magnitude of $V2=T^{-2}[(1/N)\times I2]$.

In this implementation, since the voltage to current transfer function of each of the third, fourth and to-be-biased transconductance cells 111, 114, 2 is monotonically increasing, and since a first order derivative thereof is monotonically increasing, the first and second input terminals of the amplifier 121 are respectively non-inverting and inverting input terminals so as to make the magnitude of the first voltage signal (v1) equal the magnitude of the second voltage signal (v2) (i.e., V1=V2). However, in other implementations in which each of the third, fourth and to-be-biased transconductance cells 111, 114, 2 is a device that has a monotonically increasing voltage to current transfer function and a monotonically decreasing first order derivative of the voltage to current transfer function, the first and second input terminals of the amplifier 121 are respectively inverting and non-inverting input terminals so as to make the magnitude of the first voltage signal (v1) equal the magnitude of the second voltage signal (v2) (i.e., V1=V2).

Figure 3:
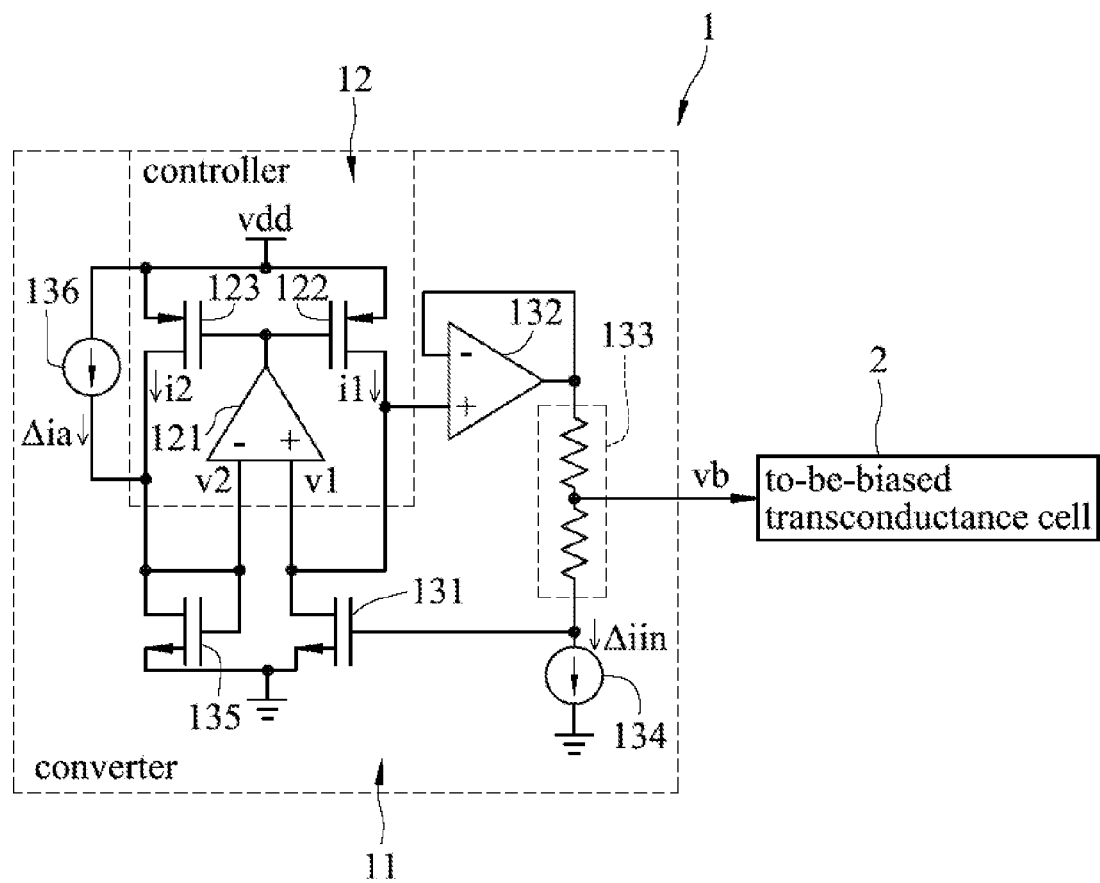
FIG. 3 is a schematic circuit block diagram illustrating a second exemplary implementation of the first embodiment.

FIG. 3 illustrates a second exemplary implementation of the bias circuit 1, which is a modification of the first exemplary implementation, and which differs from the first exemplary implementation in that B=ΔIin and in the configuration of the converter 11.

Since B=ΔIin and A=ΔIin×R, Equation 2 becomes $V1=T^{-2}$ (I1)+ΔIin×R, and Equation 3 becomes $V2=T^{-1}[(1/N)\times(I2+N\times\Delta Iin)]$.

The converter 11 includes a third transconductance cell 131, a buffer 132, a resistor string 133, a first current source 134, a fourth transconductance cell 135 and a second current source 136.

The third transconductance cell 131 (e.g., an N-channel MOSFET) has a first terminal (e.g., a gate terminal), and a second terminal (e.g., a drain terminal) that is coupled to the first input terminal of the amplifier 121 of the controller 12 and the second terminal of the first transconductance cell 122 of the controller 12. The third transconductance cell 131 has a voltage to current transfer function of T(·) from the first terminal thereof to the second terminal thereof.

The buffer 132 has an input terminal coupled to the second terminal of the third transconductance cell 131, and an output terminal.

The resistor string 133 has a first end terminal that is coupled to the output terminal of the buffer 132, a second end terminal that is coupled to the first terminal of the third transconductance cell 131, and an intermediate terminal that provides the bias voltage (vb). The resistor string 133 has a resistance of R between the first and second end terminals thereof, and a resistance of K×R between the first end and intermediate terminals thereof.

The first current source 134 is coupled to the first terminal of the third transconductance cell 131, and provides the reference current signal (Δiin) that flows through the resistor string 133.

The fourth transconductance cell 135 (e.g., an N-channel MOSFET) has a first terminal (e.g., a gate terminal), and a second terminal (e.g., a drain terminal) that is coupled to the first terminal of the fourth transconductance cell 135, the second input terminal of the amplifier 121 of the controller 12 and the second terminal of the second transconductance cell 123 of the controller 12. The fourth transconductance cell 135 has a voltage to current transfer function of N×T(·) from the first terminal thereof to the second terminal thereof.

The second current source 136 is coupled to the second terminal of the fourth transconductance cell 135, and provides an auxiliary current (Δia) that has a magnitude of N×ΔIin and that flows through the fourth transconductance cell 135.

In operation, the first current signal (i1) flows through the third transconductance cell 131. The third transconductance cell 131 forces a voltage at the second end terminal of the resistor string 133 to have a magnitude of $T^{-2}$ (I1). The buffer 132, the resistor string 133 and the first current source 134 cooperatively force the first voltage signal (v1) and the bias voltage (vb) to respectively have the magnitude of $V1=T^{-2}$ (I1)+ΔIin×R and the magnitude of Vb=V1−ΔIin×R×K. Besides, the second current signal (i2) and the auxiliary current (Δia) are combined into a current that has a magnitude of I2+N×ΔIin and that flows through the fourth transconductance cell 135. The fourth transconductance cell 135 forces the second voltage signal (v2) to have the magnitude of $V2=T^{-1}[(1/N)\times(I2+N\times\Delta Iin)]$.

Figure 4:
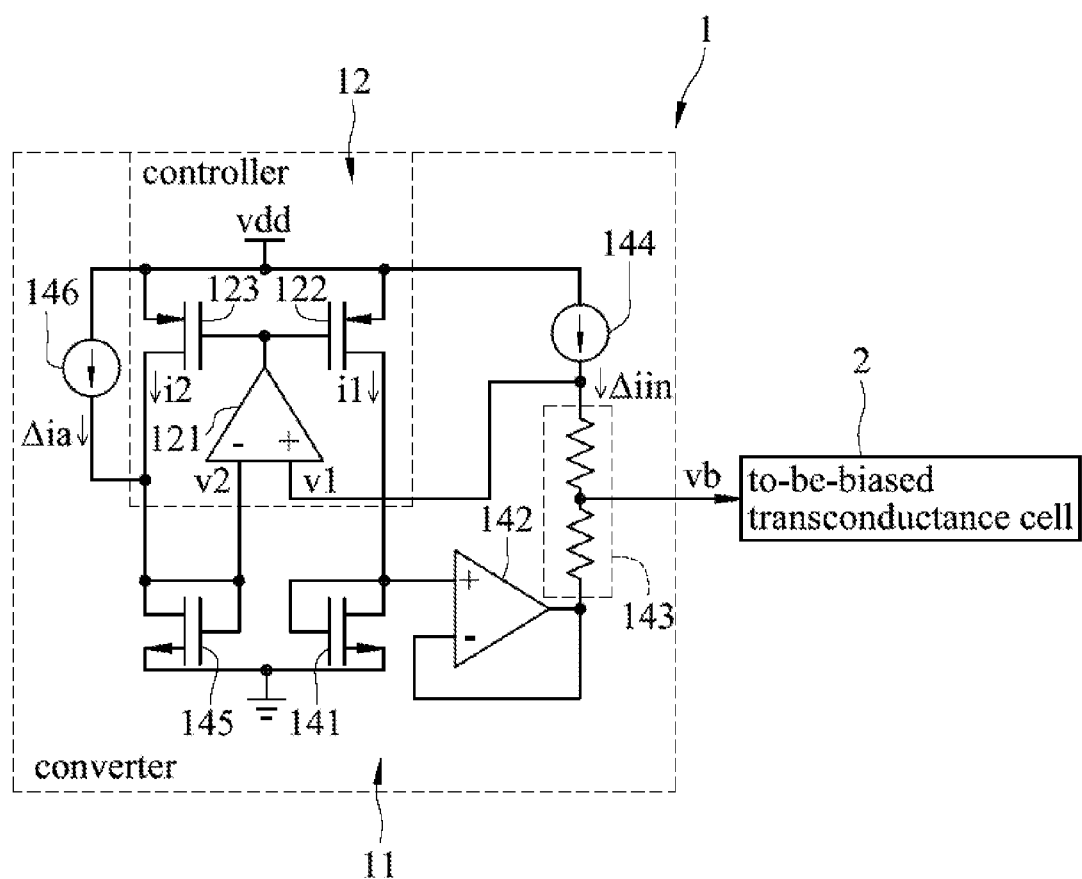
FIG. 4 is a schematic circuit block diagram illustrating a third exemplary implementation of the first embodiment.

FIG. 4 illustrates a third exemplary implementation of the bias circuit 1, which is a modification of the first exemplary implementation, and which differs from the first exemplary implementation in that B=ΔIin and in the configuration of the converter 11.

Since B=ΔIin and A=ΔIin×R, Equation 2 becomes $V1=T^{-1}$ (I1)+ΔIin×R, and Equation 3 becomes $V2=T^{-1}[(1/N)\times(I2+N\times\Delta Iin)]$.

The converter 11 includes a third transconductance cell 141, a buffet 142, a resistor string 143, a first current source 144, a fourth transconductance cell 145 and a second current source 146.

The third transconductance cell 141 (e.g., an N-channel MOSFET) has a first terminal (e.g., a gate terminal), and a second terminal (e.g., a drain terminal) that is coupled to the first terminal of the third transconductance cell 141 and the second terminal of the first transconductance cell 122 of the controller 12. The third transconductance cell 141 has a voltage to current transfer function of $T(\cdot)$ from the first terminal thereof to the second terminal thereof.

The buffer 142 has an input terminal coupled to the second terminal of the third transconductance cell 141, and an output terminal.

The resistor string 143 has a first end terminal that is coupled to the first input terminal of the amplifier 121 of the controller 12, a second end terminal that is coupled to the output terminal of the buffer 142, and an intermediate terminal that provides the bias voltage (vb). The resistor string 143 has a resistance of R between the first and second end terminals thereof, and a resistance of K×R between the first end and intermediate terminals thereof.

The first current source 144 is coupled to the first end terminal of the resistor string 143, and provides the reference current signal ($\Delta$iin) that flows through the resistor string 143.

The fourth transconductance cell 145 (e.g., an N-channel MOSFET) has a first terminal (e.g., a gate terminal), and a second terminal (e.g., a drain terminal) that is coupled to the first terminal of the fourth transconductance cell 145, the second input terminal of the amplifier 121 of the controller 12 and the second terminal of the second transconductance cell 123 of the controller 12. The fourth transconductance cell 145 has a voltage to current transfer function of N×$T(\cdot)$ from the first terminal thereof to the second terminal thereof.

The second current source 146 is coupled to the second terminal of the fourth transcondactance cell 145, and provides an auxiliary current ($\Delta$ia) that has a magnitude of N×$\Delta$Iin and that flows through the fourth transconductance cell 145.

In operation, the first current signal (i1) flows through the third transconductance cell 141. The third transconductance ceil 141 forces a voltage at the input terminal of the buffer 142 to have a magnitude of $T^{-1}$ (I1). The buffer 142, the resistor string 143 and the first current source 144 cooperatively force the first voltage signal (v1) and the bias voltage (vb) to respectively have the magnitude of V1=$T^{-1}$ (I1)+$\Delta$Iin×R and the magnitude of Vb=V1−$\Delta$Iin×R×K. Besides, the second current signal (i2) and the auxiliary current ($\Delta$ia) are combined into a current that has a magnitude of I2+N×$\Delta$Iin and that flows through the fourth transconductance cell 145. The fourth transconductance cell 145 forces the second voltage signal (v2) to have the magnitude of V2=$T^{-1}$[(1/N)×(I2+N×$\Delta$Iin)].

Figure 5:
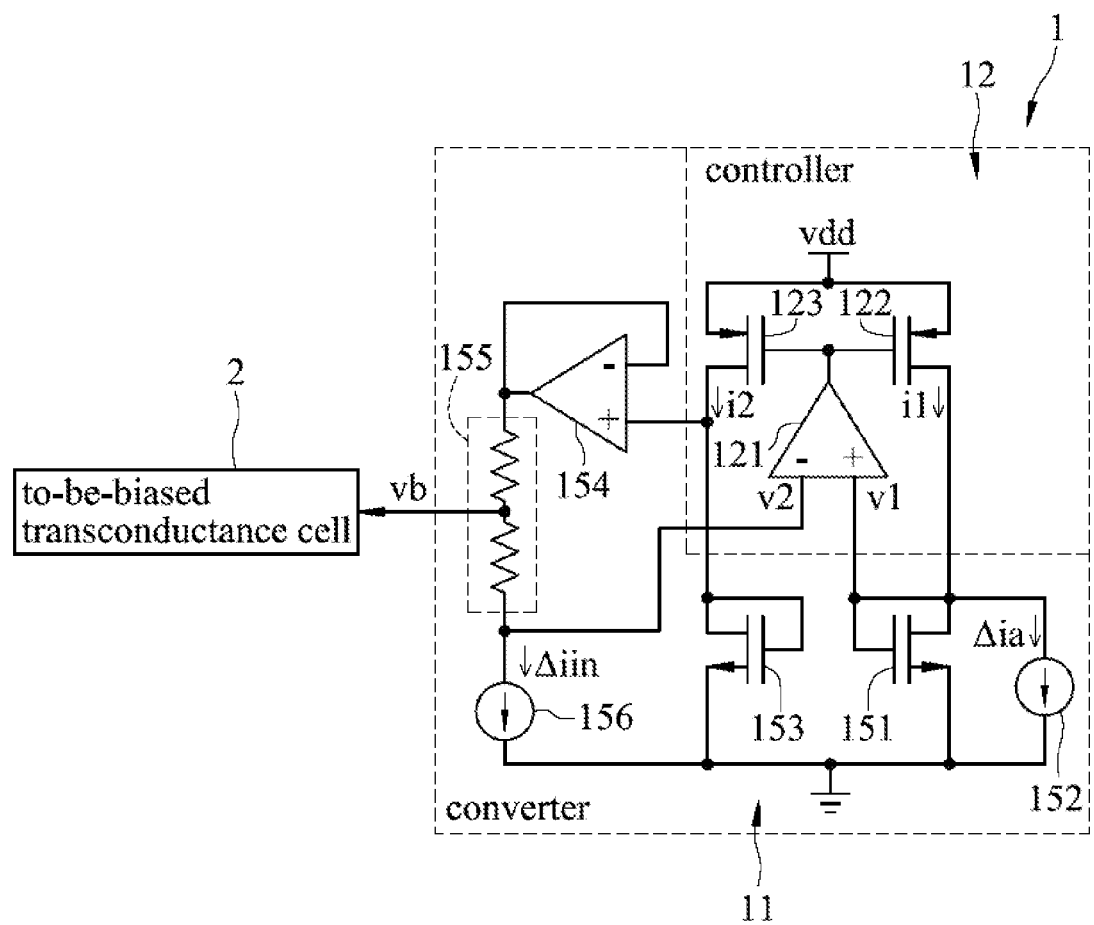
FIG. 5 is a schematic circuit block diagram illustrating a fourth exemplary implementation of the first embodiment.

FIG. 5 illustrates a fourth exemplary implementation of the bias circuit 1, which is a modification of the first exemplary implementation, and which differs from the first exemplary implementation in that A=0 and Vb=V2+$\Delta$Iin×R×K and in the configuration of the converter 11.

Since B=0 and A=0, Equation 2 becomes V1=$T^{-1}$ (I1−$\Delta$Iin), and Equation 3 becomes V2=$T^{-1}$[(1/N)×I2]−$\Delta$Iin×R.

The converter 11 includes a third transconductance cell 151, a first current source 152, a fourth transconductance cell 153, a buffer 154, a resistor string 155 and a second current source 156.

The third transconductance cell 151 (e.g., an N-channel MOSFET) has a first terminal (e.g., a gate terminal), and a second terminal (e.g., a drain terminal) that is coupled to the first terminal of the third transconductance cell 151, the first input terminal of the amplifier 121 of the controller 12 and the second terminal of the first transconductance cell 122 of the controller 12. The third transconductance cell 151 has a voltage to current transfer function of $T(\cdot)$ from the first terminal thereof to the second terminal thereof.

The first current source 152 is coupled to the second terminal of the third transconductance cell 151, and provides an auxiliary current ($\Delta$ia) that has a magnitude of $\Delta$Iin and that constitutes a portion of the first current signal (i1).

The fourth transconductance cell 153 (e.g., an N-channel MOSFET) has a first terminal (e.g., a gate terminal), and a second terminal (e.g., a drain terminal) that is coupled to the first terminal of the fourth transconductance cell 153 and the second terminal of the second transconductance cell 123 of the controller 12. The fourth transconductance cell 153 has a voltage to current transfer function of N×$T(\cdot)$ from the first terminal thereof to the second terminal thereof.

The buffer 154 has an input terminal coupled to the second terminal of the fourth transconductance cell 153, and an output terminal.

The resistor string 155 has a first end terminal that is coupled to the second input terminal of the amplifier 121 of the controller 12, a second end terminal that is coupled to the output terminal of the buffer 154, and an intermediate terminal that provides the bias voltage (vb). The resistor string 155 has a resistance of R between the first and second end terminals thereof, and a resistance of K×R between the first end and intermediate terminals thereof.

The second current source 156 is coupled to the first end terminal of the resistor string 155, and provides the reference current signal ($\Delta$iin) that flows through the resistor string 155.

In operation, the first current signal (i1) is divided into the auxiliary current ($\Delta$ia) and a current that has a magnitude of I1−$\Delta$Iin and that flows through the third transconductance cell 151. The third transconductance cell 151 forces the first voltage signal (v1) to have the magnitude of V1=$T^{-1}$(I1−$\Delta$Iin). Besides, the second current signal (i2) flows through the fourth transconductance cell 153. The fourth transconductance cell 153 forces a voltage at the input terminal of the buffer 154 to have a magnitude of $T^{-1}$[(1/N)×I2]. The buffer 154, the resistor string 155 and the second current source 156 cooperatively force the second voltage signal (v2) and the bias voltage (vb) to respectively have the magnitude of V2=$T^{-1}$[(1/N)×I2]−$\Delta$Iin×R and the magnitude of Vb=V2+$\Delta$Iin×R×K.

Figure 6:
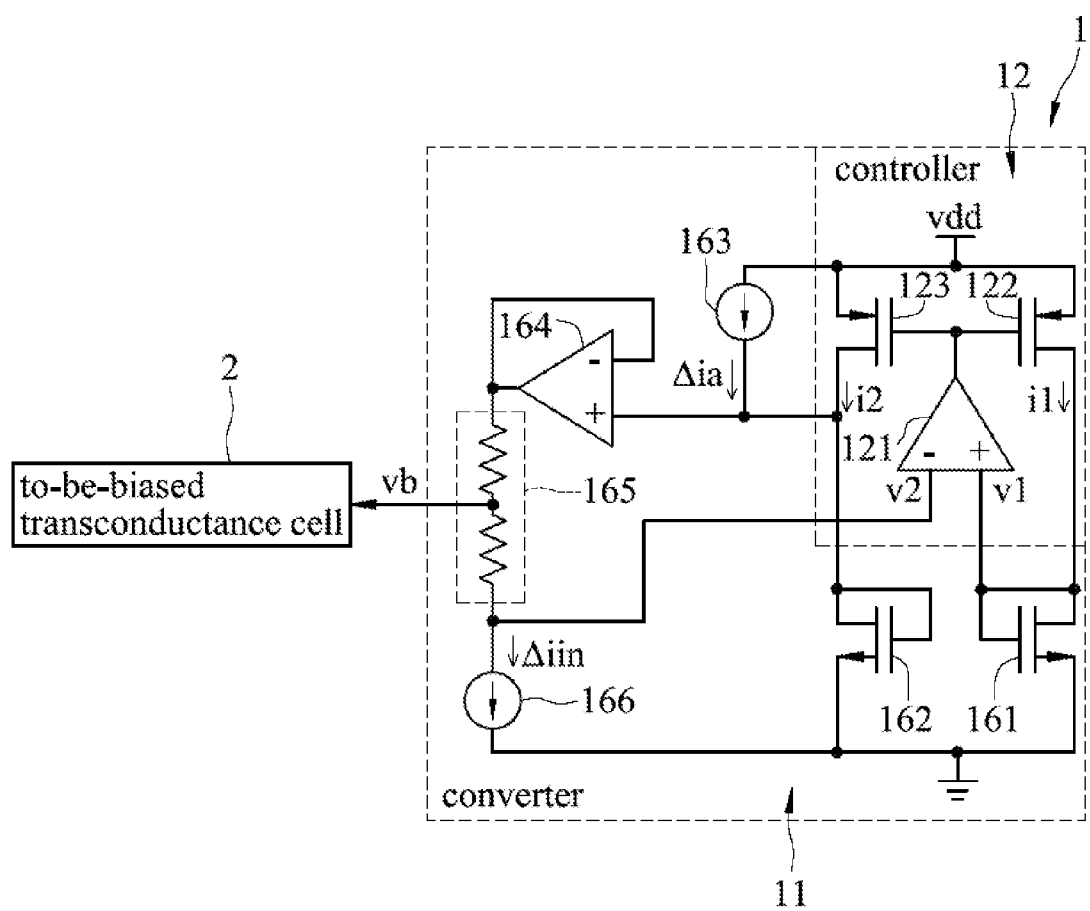
FIG. 6 is a schematic circuit block diagram illustrating a fifth exemplary implementation of the first embodiment.

FIG. 6 illustrates a fifth exemplary implementation of the bias circuit 1, which is a modification of the first exemplary implementation, and which differs from the first exemplary implementation in that B=$\Delta$Iin, A=0 and Vb=V2+$\Delta$Iin×R×K and in the configuration of the converter 11.

Since B=$\Delta$Iin and A=0, Equation 2 becomes V1=$T^{-1}$ (I1), and Equation 3 becomes V2=$T^{-1}$[(1/N)×(I2+N×$\Delta$Iin)]−$\Delta$Iin×R.

The converter 11 includes a third transconductance cell 161, a fourth transconductance cell 162, a first current source 163, a buffer 164, a resistor string 165 and a second current source 166.

The third transconductance cell 161 (e.g., an N-channel MOSFET) has a first terminal (e.g., a gate terminal), and a second terminal (e.g., a drain terminal) that is coupled to the first terminal of the third transconductance cell 161, the first input terminal of the amplifier 121 of the controller 12 and the second terminal of the first transconductance cell 122 of the controller 12. The third transconductance cell 161 has a voltage to current transfer function of $T(\cdot)$ from the first terminal thereof to the second terminal thereof.

The fourth transconductance cell 162 (e.g., an N-channel MOSFET) has a first terminal (e.g., a gate terminal), and a second terminal (e.g., a drain terminal) that is coupled to the first terminal of the fourth transconductance cell 162 and the second terminal of the second transconductance cell 123 of the controller 12. The fourth transconductance cell 162 has a voltage to current transfer function of N×T(·) from the first terminal thereof to the second terminal thereof.

The first current source 163 is coupled to the second terminal of the fourth transconductance cell 162, and provides an auxiliary current (Δia) that has a magnitude of N×ΔIin and that flows through the fourth transconductance cell 162.

The buffer 164 has an input terminal coupled to the second terminal of the fourth transconductance cell 162, and an output terminal.

The resistor string 165 has a first end terminal that is coupled to the second input terminal of the amplifier 121 of the controller 12, a second end terminal that is coupled to the output terminal of the buffer 164, and an intermediate terminal that provides the bias voltage (vb). The resistor string 165 has a resistance of R between the first and second end terminals thereof, and a resistance of K×R between the first end and intermediate terminals thereof.

The second current source 166 is coupled to the first end terminal of the resistor string 165, and provides the reference current signal (Δiin) that flows through the resistor string 165.

In operation, the first current signal (i1) flows through the third transconductance cell 161. The third transconductance cell 161 forces the first voltage signal (v1) to have the magnitude of V1=T$^{-1}$ (I1). Besides, the second current signal (i2) and the auxiliary current (Δia) are combined into a current that has a magnitude of I2+N×ΔIin and that flows through the fourth transconductance cell 162. The fourth transconductance cell 162 forces a voltage at the input terminal of the buffer 164 to have a magnitude of T$^{-1}$[(1/N)×(I2+N×ΔIin)]. The buffer 164, the resistor string 165 and the second current source 166 cooperatively force the second voltage signal (v2) and the bias voltage (vb) to respectively have the magnitude of V2=T$^{-1}$[(1/N)×(I2+N×ΔIin)]−ΔIin×R and the magnitude of Vb=V2+ΔIin×R×K.

It is noted that, in other implementations of the bias circuit 1, each of the first, second and reference current signals (i1, i2, Δiin) may be a digital representation of a current, and each of the first and second voltage signals (v1, v2) may be a digital representation of a voltage. Here, for example, the functions of all the elements of the converter 11 except the third and fourth transconductance cells and the function of the controller 12 may be performed digitally.

In view of the above, the bias circuit 1 of this embodiment has the following advantages:

1. Since the bias circuit 1 operates properly when T(·) is smooth and monotonic, the bias circuit 1 is relatively flexible compared to the conventional constant transconductance bias circuit.

2. With the properly configured K, the bias circuit 1 can be used to bias the to-be-biased transconductance cell 2 regardless of whether the to-be-biased transconductance cell 2 is used in a large signal operation or a small signal operation.

3. When the reference current signal (Δiin) is constant, an actual swing of the output current of the to-be-biased transconductance cell 2 in response to an input voltage with a swing of ΔIin×R is independent of the fabrication process, the power supply voltage and the temperature.

4. When the magnitude of the reference current signal (Δiin) is determined based on the expected swing of the output current of the to-be-biased transconductance cell 2, linearity of the actual swing of the output current of the to-be-biased transconductance cell 2 in response to the input voltage with the swing of ΔIin×R is relatively high.

Figure 7:
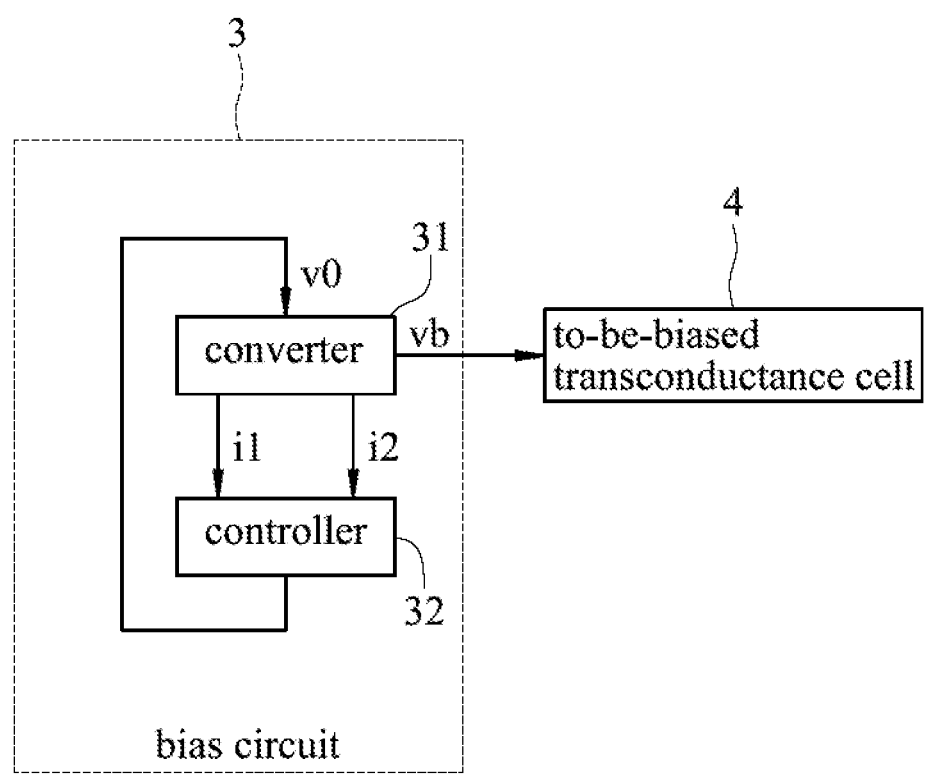
FIG. 7 is a schematic block diagram illustrating a second embodiment of a bias circuit according to this disclosure.

Referring to FIG. 7, a second embodiment of a bias circuit 3 according to this disclosure is adapted for biasing a to-be-biased transconductance cell 4 such that the to-be-biased transconductance cell 4 has a constant transconductance. The to-be-biased transconductance cell 4 has a voltage to current transfer function of P×T(·), where P is a predetermined constant greater than zero (i.e., P>0) and T(·) is smooth and monotonic (e.g., monotonically increasing or monotonically decreasing). As an example, the to-be-biased transconductance cell 4 may be an N-channel MOSFET, and P is associated with a width to length ratio thereof. The bias circuit 3 includes a converter 31 and a controller 32.

The converter 31 receives a voltage signal (v0), and generates, based on the voltage signal (v0), a first current signal (i1), a second current signal (i2) and a bias voltage (vb) that is for biasing the to-be-biased transconductance cell 4.

In this embodiment, the converter 31 may be designed according to predetermined relationship among the voltage signal (v0), the first and second current signals (i1, i2) and the bias voltage (vb), as can be expressed by the following equations:

$$I1 = T(V0 \Delta Iin \times R + A) + B, \qquad \text{Equation 5}$$

$$I2 = N + T(V0 + A) + N \times \Delta Iin + N \times B, \qquad \text{Equation 6}$$

$$Vb = \{V0 + \Delta Iin \times R \times K \text{ or } V0 - \Delta Iin \times R \times K\}, \qquad \text{Equation 7}$$

where "V0" denotes a magnitude of the voltage signal (v0), "I1" and "I2" respectively denote magnitudes of the first and second current signals (i1, i2), Vb denotes a magnitude of the bias voltage (vb), "T(·)" denotes a voltage to current transfer function associated with the to-be-biased transconductance cell 4, "ΔIin" denotes a magnitude of a predetermined reference current signal (Δiin) (see FIG. 8), "A" denotes a predetermined voltage value, "B" denotes a predetermined current value, "N" denotes a predetermined constant greater than zero (i.e., N>0), "R" denotes a predetermined resistance value, and "K" denotes a predetermined constant greater than zero and smaller than one (i.e., 0<K<1). Details of these parameters may be described in the following implementations. Preferably, the reference current signal (Δiin) (see FIG. 8) is constant, and the magnitude thereof is determined based on an expected swing of an output current of the to-be-biased transconductance cell 4 (i.e., the magnitude is proportional the expected swing).

The controller 32 is coupled to the converter 31, receives the first and second current signals (i1, i2) from the converter 31, and generates the voltage signal (v0) for the converter 31 based on the first and second current signals (i1, i2) so as to make the magnitude of the first current signal (i1) equal 1/N times the magnitude of the second current signal (i2) (i.e., I1=(1/N)×I2).

Equation 5 can be rearranged as I1−B=T(V0+ΔIin×R×A). Since I1=(1/N)×I2, Equation 6 can be rearranged as I1−ΔIin−B=T(V0+A). Regardless of whether a first order derivative of T(·) is monotonically increasing or monotonically decreasing, the large signal transconductance of the to-be-biased transconductance cell 4 is independent of a fabrication process, a power supply voltage and a temperature associated with the bias circuit 3 and the to-be-biased transconductance cell 4, and equals P×[(I1−B)−(I1−ΔIin−B)]/[(V0+ΔIin×R+A)−(V0+A)]=P/R. Besides, K is configured to minimize the dependence of the small signal transconductance of the to-be-biased transconductance cell 4 on the fabrication process, the power supply voltage and the temperature.

Figure 8:
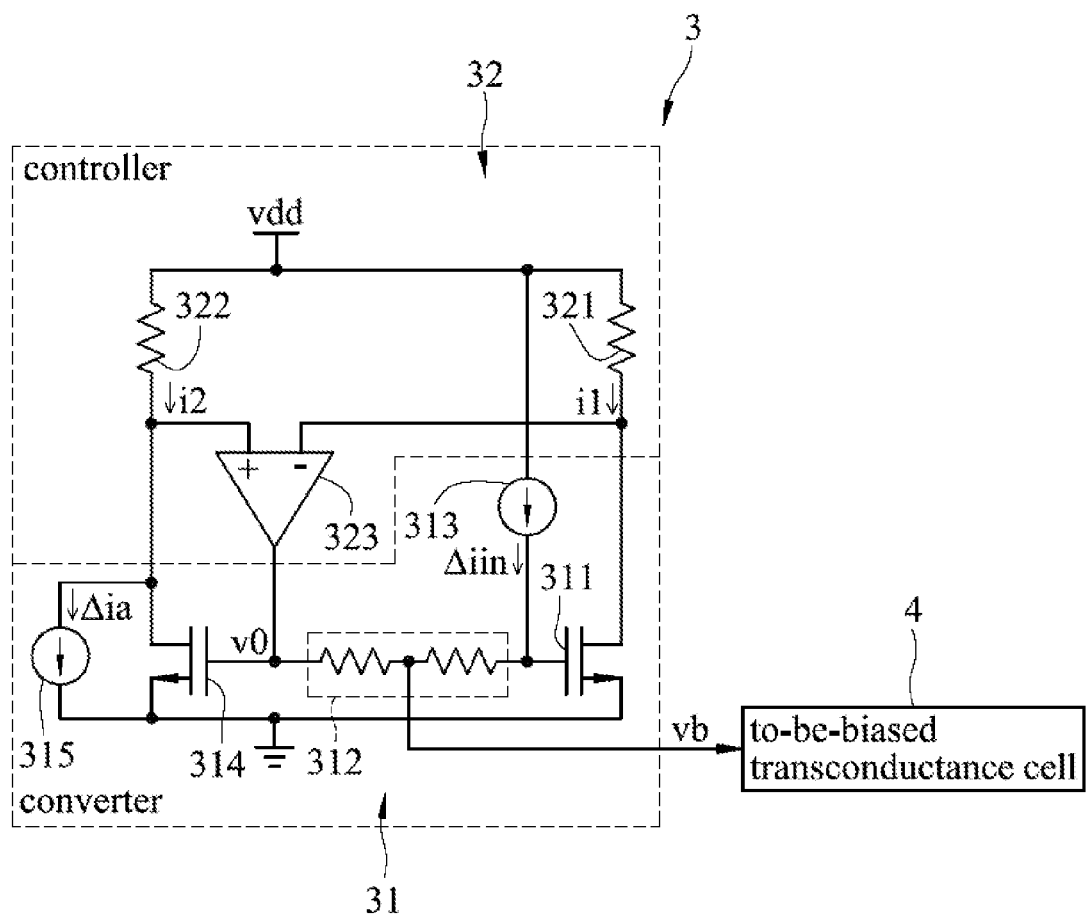
FIG. 8 is a schematic circuit block diagram illustrating a first exemplary implementation of the second embodiment.

FIG. 8 illustrates a first exemplary implementation of the bias circuit 3. In the first implementation, the voltage signal (v0) is an analog voltage signal, and each of the first, second and reference current signals i1, i2, Δiin) is an analog current signal.

In addition, the controller 32 includes a first resistor 321, a second resistor 322 and an amplifier 323.

The first resistor 321 has a first terminal coupled to the converter 31 for receiving therefrom the first current signal (i1), and a second terminal coupled to a reference node, to which the power supply voltage (vdd) is supplied.

The second resistor 322 has a first terminal coupled to the converter 31 for receiving therefrom the second current signal (i2), and a second terminal coupled to the second terminal of the first resistor 321. The second resistor 323 has a resistance 1/N times that of the first resistor 321.

The amplifier 323 has a first input terminal coupled to the first terminal of the first resistor 321, a second input terminal coupled to the first terminal of the second resistor 322, and an output terminal coupled to the converter 31. The amplifier 323 generates the voltage signal (v0) based on voltages respectively at the first terminals of the first and second resistors 321, 322, and outputs the voltage signal (v0) at the output terminal thereof.

In this implementation, values of A, B and Vb are designed as A=0, B=0, Vb=V0+$\Delta$Iin×R×K, so that Equation 5 becomes I1=T(V0+$\Delta$Iin×R, and Equation 6 becomes I2=N×T(V0)+N×$\Delta$Iin. The converter 31 is configured according to the Equations 5 and 6, and includes a first transconductance cell 311, a resistor string 312, a first current source 313, a second transconductance cell 314 and a second current source 315.

The first transconductance cell 311 has a first terminal, and a second terminal that is coupled to the first terminal of the first resistor 321 of the controller 32. The first transconductance cell 311 has a voltage to current transfer function of T(·) from the first terminal thereof to the second terminal thereof.

The resistor string 312 has a first end terminal that is coupled to the output terminal of the amplifier 323 of the controller 32, a second end terminal that is coupled to the first terminal of the first transconductance cell 311, and an intermediate terminal that provides the bias voltage (vb). The resistor string 312 has a resistance of R between the first and second end terminals thereof, and a resistance of K×R between the first end and intermediate terminals thereof.

The first current source 313 is coupled to the first terminal of the first transconductance cell 311, and provides the reference current signal ($\Delta$iin) that flows through the resistor string 312.

The second transconductance cell 314 has a first terminal coupled to the output terminal of the amplifier 323 of the controller 32, and a second terminal coupled to the first terminal of the second resistor 322 of the cent roller 32. The second transconductance cell 314 has a voltage to current transfer function of N×T(·) from the first terminal thereof to the second terminal thereof.

The second current source 315 is coupled to the second terminal of the second transconductance cell 314, and provides an auxiliary current ($\Delta$ia) that has a magnitude of N×$\Delta$Iin and that constitutes a portion of the second current signal (i2).

In this implementation, each of the first and second transconductance cells 311, 314 is, for example, an N-channel MOSFET that has a gate terminal serving as the first terminal, a drain terminal serving as the second terminal, and a grounded source terminal. The second transconductance cell 314 has a width to length ratio N times that of the first transconductance cell 311. The to-be-biased transconductance cell 4 has the width to length ratio P times that of the first transconductance cell 311. It is noted that the first, second and to-be-biased transconductance cells 311, 314, 4 may all operate in a saturation region or a sub-threshold region.

In operation, the resistor string 312 and the first current source 313 cooperatively force a voltage at the first terminal of the first transconductance cell 311 and the bias voltage (vb) to respectively have a magnitude of V0+$\Delta$Iin×R and the magnitude of Vb=V0+$\Delta$Iin×R×K. The first transconductance cell 311 generates the first current signal (i1) with the magnitude of I1=T(V0+$\Delta$Iin×R). Besides, the second transconductance cell 314 generates a current with a magnitude of N×T(V0). The second current signal (i2) includes the current generated by the second transconductance cell 314 and the auxiliary current ($\Delta$ia), and has the magnitude of I2=N×T(V0)+N×$\Delta$Iin.

In this implementation, since the voltage to current transfer function of each of the first, second and to-be-biased transconductance cells 311, 314, 4 is monotonically increasing, and since a first order derivative thereof is monotonically increasing, the first and second input terminals of the amplifier 323 are respectively inverting and non-inverting input terminals so as to make the magnitude of the first current signal (i1) equal 1/N times the magnitude of the second current signal (i2) (i.e., I1=(1/N)×I2). However, in other implementations in which each of the first, second and to-be-biased transconductance cells 311, 314, 4 is a device that has a monotonically increasing voltage to current transfer function and a monotonically decreasing first order derivative of the voltage to current transfer function, the first and second input terminals of the amplifier 323 are respectively non-inverting and inverting input terminals so as to make the magnitude of the first current signal (i1) equal 1/N times the magnitude of the second current signal (i2) (i.e., I1=(1/N)×I2).

Figure 9:
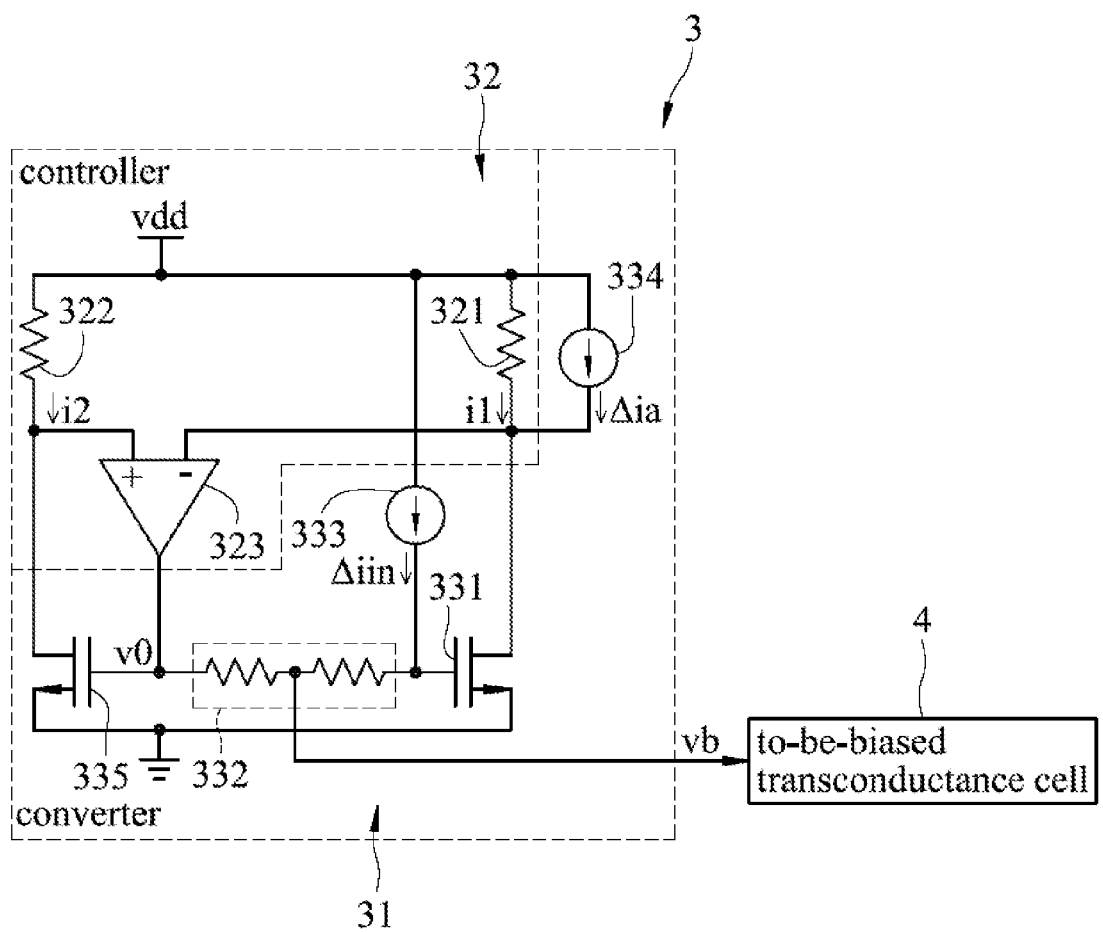
FIG. 9 is a schematic circuit block diagram illustrating a second exemplary implementation of the second embodiment.

FIG. 9 illustrates a second exemplary implementation of the bias circuit 3, which is a modification of the first exemplary implementation, and which differs from the first exemplary implementation in that B=–$\Delta$Iin and in the configuration of the converter 31.

Since A=0 and B=–$\Delta$Iin, Equation 5 becomes I1=T(V0$\Delta$Iin×R)–$\Delta$Iin, and Equation 6 becomes I2=N×T(V0).

The converter 31 includes a first transconductance cell 331, a resistor string 332, a first current source 333, a second current source 334 and a second transconductance cell 335.

The first transconductance cell 331 (e.g., an N-channel MOSFET) has a first terminal (e.g., a gate terminal), and a second terminal (e.g., a drain terminal) that is coupled to the first terminal of the first resistor 321 of the controller 32. The first transconductance cell 331 has a voltage to current transfer function of T(·) from the first terminal thereof to the second terminal thereof.

The resistor string 332 has a first end terminal that is coupled to the output terminal of the amplifier 323 of the controller 32, a second end terminal that is coupled to the first terminal of the first transconductance cell 331, and an intermediate terminal that provides the bias voltage (vb). The resistor string 332 has a resistance of R between the first and second end terminals thereof, and a resistance of K×R between the first end and intermediate terminals thereof.

The first current source 333 is coupled to the first terminal of the first transconductance cell 331, and provides the reference current signal ($\Delta$iin) that flows through the resistor string 332.

The second current source 334 is coupled to the second terminal of the first transconductance cell 331, and provides an auxiliary current ($\Delta$ia) that has a magnitude of $\Delta$Iin and that flows through the first transconductance cell 331.

The second transconductance cell 335 (e.g., an N-channel MOSFET) has a first terminal (e.g., a gate terminal) coupled to the output terminal of the amplifier 323 of the controller 32, and a second terminal (e.g., a drain terminal) coupled to the first terminal of the second resistor 322 of the controller 32.

The second transconductance cell 335 has a voltage to current transfer function of N×T(·) from the first terminal thereof to the second terminal thereof.

In operation, the resistor string 332 and the first current source 333 cooperatively force a voltage at the first terminal of the first transconductance cell 331 and the bias voltage (vb) to respectively have a magnitude of V0+ΔIin×R and the magnitude of Vb=V0+ΔIin×R×K. The first transconductance cell 331 generates a current with a magnitude of T(V0+ΔIin×R). The current generated by the first transconductance cell 331 includes the auxiliary current (Δia) and the first current signal (i1) with the magnitude of I1=T(V0+ΔIin×R)−ΔIin. Besides, the second transconductance cell 335 generates the second current signal (i2) with the magnitude of I2=N×T(V0).

Figure 10:
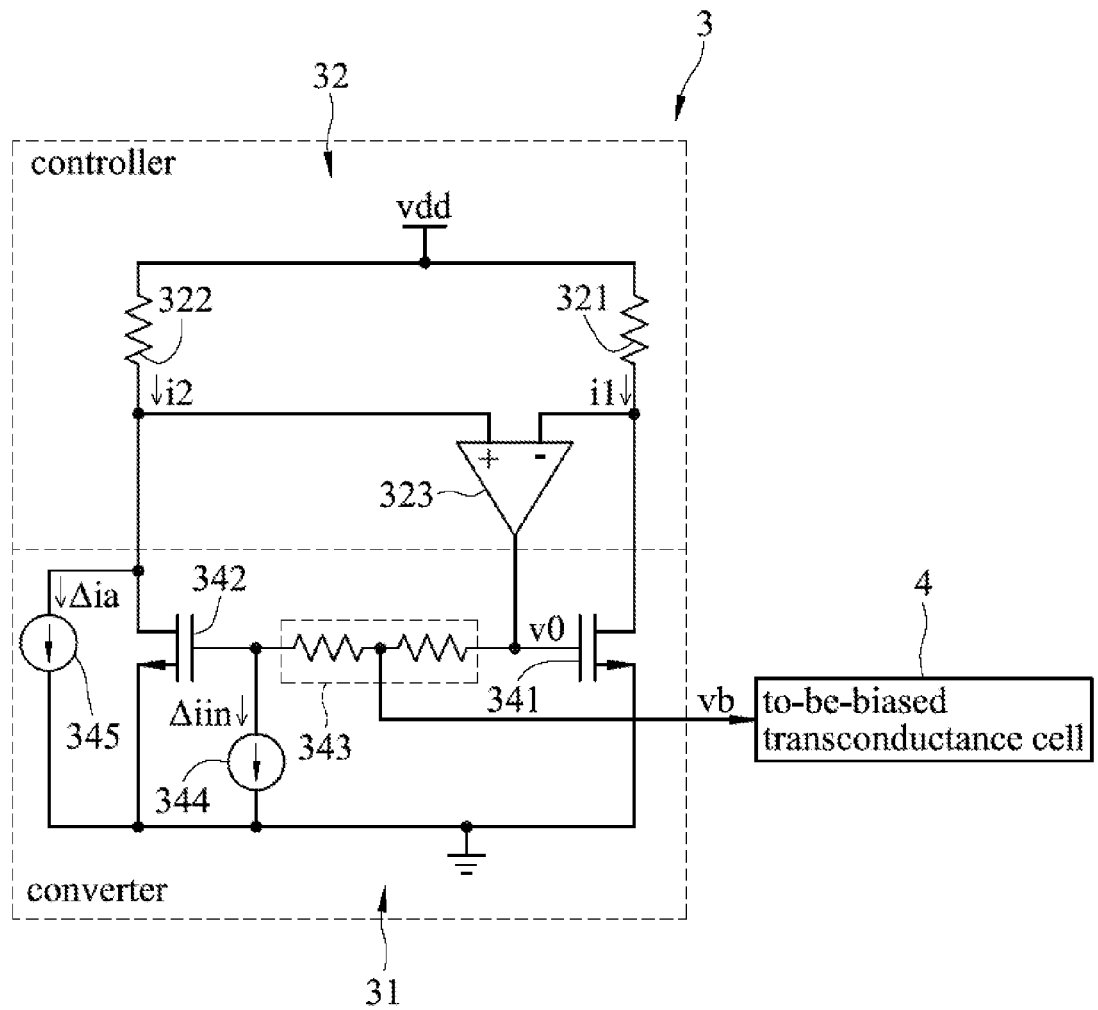
FIG. 10 is a schematic circuit block diagram illustrating a third exemplary implementation of the second embodiment.

FIG. 10 illustrates a third exemplary implementation of the bias circuit 3, which is a modification of the first exemplary implementation, and which differs from the first exemplary implementation in that A=−ΔIin×R and Vb=V0−ΔIin×R×K and in the configuration of the converter 31.

Since A=−ΔIin×R and B=0, Equation 5 becomes I1=T(V0), and Equation 6 becomes I2=N×T(V0−ΔIin×R)+N×ΔIin.

The converter 31 includes a first transconductance cell 341, a second transconductance ceil 342, a resistor string 343, a first current source 344 and a second current source 345.

The first transconductance cell 341 (e.g., an N-channel MOSFET) has a first terminal (e.g., a gate terminal) coupled to the output terminal of the amplifier 323 of the controller 32, and a second terminal (e.g., a drain terminal) coupled to the first terminal of the first resistor 321 of the controller 32. The first transconductance cell 341 has a voltage to current transfer function of T (·) from the first terminal thereof to the second terminal thereof.

The second transconductance cell 342 (e.g., an N-channel MOSFET) has a first terminal (e.g., a gate terminal), and a second terminal (e.g., a drain terminal) that is coupled to the first terminal of the second resistor 322 of the controller 32. The second transconductance cell 342 has a voltage to current transfer function of N×T(·) from the first terminal tnereof to the second terminal thereof.

The resistor string 343 has a first end terminal that is coupled to the output terminal of the amplifier 323 of the controller 32, a second end terminal that is coupled to the first terminal of the second transconductance cell 342, and an intermediate terminal that provides the bias voltage (vb). The resistor string 343 has a resistance of R between the first and second end terminals thereof, and a resistance of K×R between the first end and intermediate terminals thereof.

The first current source 344 is coupled to the first terminal of the second transconductance cell 342, and provides the reference current signal (Δiin) that flows through the resistor string 343.

The second current source 345 is coupled to the second terminal of the second transconductance cell 342, and provides an auxiliary current (Δia) that has a magnitude of N×ΔIin and that constitutes a portion of the second current signal (i2).

In operation, the first transconductance cell 341 generates the first current signal (i1) with the magnitude of I1=T(V0). Besides, the resistor string 343 and the first current source 344 cooperatively force a voltage at the first terminal of the second transconductance cell 342 and the bias voltage (vb) to respectively have a magnitude of V0−ΔIin×R and the magnitude of Vb=V0−ΔIin×R×K. The second transconductance cell 342 generates a current with a magnitude of N×T(V0−ΔIin×R).

The second current signal (i2) includes the current generated by the second transconductance cell 342 and the auxiliary current (Δia), and has the magnitude of I2=N×T(V0−ΔIin×R)+N×ΔIin.

Figure 11:
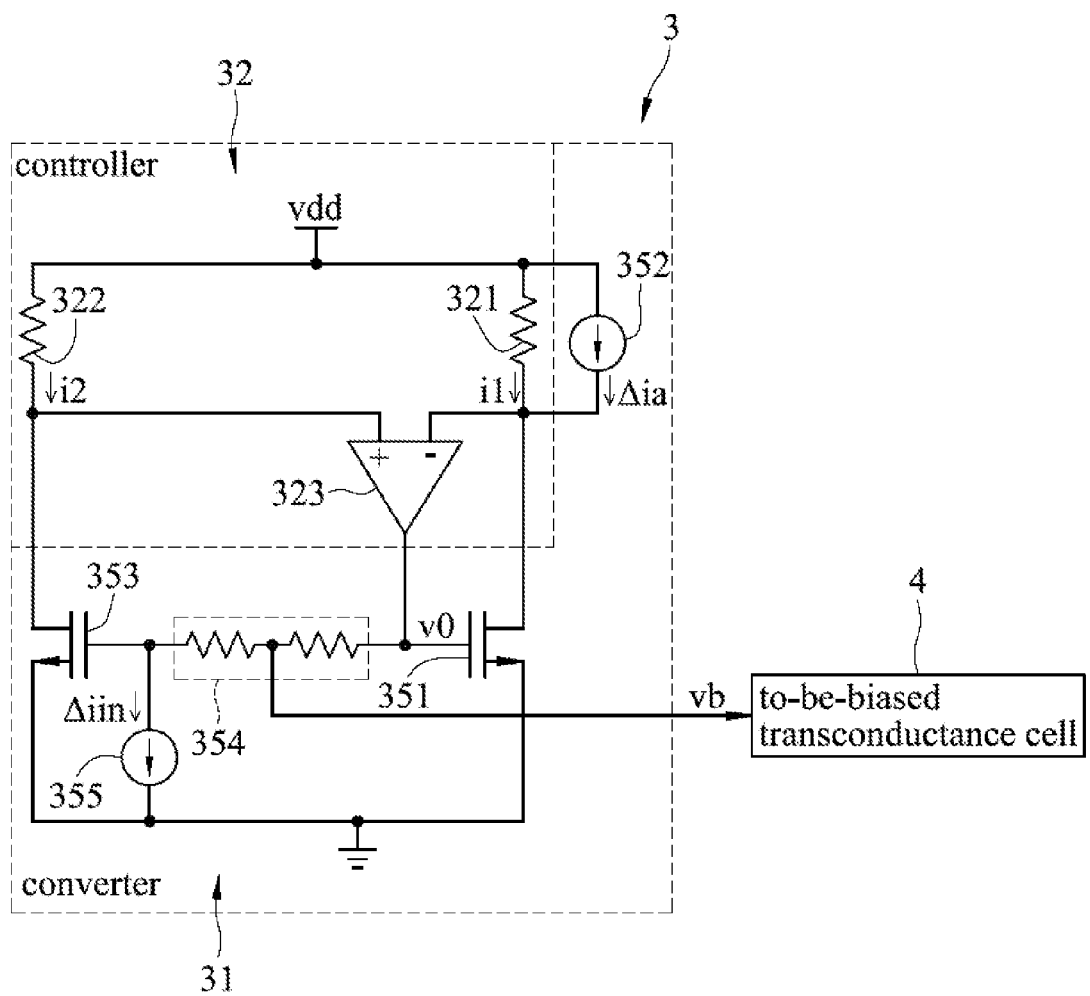
FIG. 11 is a schematic circuit block diagram illustrating a fourth exemplary implementation of the second embodiment.

FIG. 11 illustrates a fourth exemplary implementation of the bias circuit 3, which is a modification of the first exemplary implementation, and which differs from the first exemplary implementation in that A=−ΔIin×R, B=−Iin and Vb=V0−ΔIin×R×K, and in the configuration of the converter 31.

Since A=−ΔIin×R and B=−Iin, Equation 5 becomes I1=T(V0)−ΔIin, and Equation 6 becomes I2=N×T(V0−ΔIin×R).

The converter 31 includes a first transconductance cell 351, a first current source 352, a second transconductance cell 353, a resistor string 354 and a second current source 355.

The first transconductance cell 351 (e.g., an N-channel MOSFET) has a first terminal (e.g., a gate terminal) coupled to the output terminal of the amplifier 323 of the controller 32, and a second terminal (e.g., a drain terminal) coupled to the first terminal of the first resistor 321 of the controller 32. The first transconductance cell 351 has a voltage to current transfer function of T(·) from the first terminal thereof to the second terminal thereof.

The first current source 352 is coupled to the second terminal of the first transconductance cell 351, and provides an auxiliary current (Δia) that has a magnitude of ΔIin and that flows through the first transconductance cell 351.

The second transconductance cell 353 (e.g., an N-channel MOSFET) has a first terminal (e.g., a gate terminal), and a second terminal (e.g., a drain terminal) that is coupled to the first terminal of the second resistor 322 of the controller 32. The second transconductance cell 353 has a voltage to current transfer function of N×T(·) from the first terminal thereof to the second terminal thereof.

The resistor string 354 has a first end terminal that is coupled to the output terminal of the amplifier 323 of the controller 32, a second end terminal that is coupled to the first terminal of the second transconductance cell 353, and an intermediate terminal that provides the bias voltage (vb). The resistor string 354 has a resistance of R between the first and second end terminals thereof, and a resistance of K×R between the first end and intermediate terminals thereof.

The second current source 355 is coupled to the first terminal of the second transconductance cell 353, and provides the reference current signal (ΔIin) that flows through the resistor string 354.

In operation, the first transconductance cell 351 generates a current with a magnitude of T (V0). The current generated by the first transconductance cell 351 includes the auxiliary current (Δia) and the first current signal (i1) with the magnitude of I1=T (V0)−ΔIin. Besides, the resistor string 354 and the second current source 355 cooperatively force a voltage at the first terminal of the second transconductance cell 353 and the bias voltage (vb) to respectively have a magnitude of V0−ΔIin×R and the magnitude of Vb=V0−ΔIin×R×K. The second transconductance cell 353 generates the second current signal (i2) with the magnitude of I2=N×T (V0−ΔIin×R).

It is noted that, in other implementations of the bias circuit 3, the voltage signal (v0) may be a digital representation of a voltage, and each of the first, second and reference current signals (i1, i2, Δiin) may be a digital representation of a current. Here, for example, the functions of all the elements of the converter 31 except the first and second transconductance cells and the function of the controller 32 may be performed digitally.

In view of the above, the bias circuit 3 of this embodiment has the following advantages:

1. Since the bias circuit 3 operates properly when T(·) is smooth and monotonic, the bias circuit 3 is relatively flexible compared to the conventional constant transconductance bias circuit.

2. With the properly configured K, the bias circuit 3 can be used to bias the to-be-biased transconductance cell 4 regardless of whether the to-be-biased transconductance cell 4 is used in a large signal operation or a small signal operation.

3. When the reference current signal (ΔIin) is constant, an actual swing of the output current of the to-be-biased transconductance cell 4 in response to an input voltage with a swing of ΔIin×R is independent of the fabrication process, the power supply voltage and the temperature.

4. When the magnitude of the reference current signal (ΔIin) is determined based on the expected swing of the output current of the to-be-biased transconductance cell 4, linearity of the actual swing of the output current of the to-be-biased transconductance cell 4 in response to the input voltage with the swing of ΔIin×R is relatively high.

While this disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A bias circuit adapted for biasing a to-be-biased transconductance cell such that the to-be-biased transconductance cell has a constant transconductance, said bias circuit comprising:

a converter receiving a first current signal and a second current signal, and generating, based on the first and second current signals, a first voltage signal, a second voltage signal and a bias voltage that is for biasing the to-be-biased transconductance cell, in which $$I2 = N \times I1,$$

$$V1 = T^{-1}(I1 - \Delta Iin + B) + A,$$

$$V2 = T^{-1}[(1/N) \times (I2 + N \times B)] - \Delta Iin \times R + A, \text{ and}$$

$$Vb = \{Vm + \Delta Iin \times R \times K \text{ or } Vm - \Delta Iin \times R \times K\},$$

where I1 and I2 respectively denote magnitudes of the first and second current signals, V1 and V2 respectively denote magnitudes of the first and second voltage signals, Vb denotes a magnitude of the bias voltage, $T^{-1}(\cdot)$ denotes a current to voltage inverse transfer function associated with the to-be-biased transconductance cell, ΔIin denotes a magnitude of a reference current signal which is predetermined, B denotes a predetermined current value, A denotes a predetermined voltage value, N denotes a predetermined constant greater than zero, R denotes a predetermined resistance value, m={1 or 2}, and K denotes a predetermined constant greater than zero and smaller than one; and a controller coupled to said converter, receiving the first and second voltage signals from said converter, and generating the first and second current signals for said converter based on the first and second voltage signals so as to make the magnitude of the first voltage signal equal the magnitude of the second voltage signal.

2. The bias circuit of claim 1, wherein the reference current signal is constant.

3. The bias circuit of claim 1, wherein each of the first, second and reference current signals is an analog current signal, and each of the first and second voltage signals is an analog voltage signal.

4. The bias circuit of claim 3, wherein said controller includes:

an amplifier having a first input terminal and a second input terminal that are coupled to said converter for respectively receiving the first and second voltage signals therefrom, and an output terminal, said amplifier generating a control voltage based on the first and second voltage signals, and outputting the control voltage at said output terminal thereof;

a first transconductance cell having a first terminal that is coupled to said output terminal of said amplifier for receiving the control voltage there from, and a second terminal that is coupled to said converter, said first transconductance cell converting the control voltage into the first current signal, and outputting the first current signal at said second terminal thereof; and a second transconductance cell having a first terminal that is coupled to said output terminal of said amplifier for receiving the control voltage therefrom, and a second terminal that is coupled to said converter, said second transconductance cell converting the control voltage into the second current signal, and outputting the second current signal at said second terminal thereof.

5. The bias circuit of claim 4, wherein B=0, A=ΔIin×R, and said converter includes:

a third transconductance cell having a first terminal, and a second terminal that is coupled to said first input terminal of said amplifier of said controller and said second terminal of said first transconductance cell of said controller, said third transconductance cell having a voltage to current transfer function of T(·) from said first terminal thereof to said second terminal thereof;

a resistor string having a first end terminal that is coupled to said second terminal of said third transconductance cell, a second end terminal that is coupled to said first terminal of said third transconductance cell, and an intermediate terminal that provides the bias voltage, said resistor string having a resistance of R between said first and second end terminals thereof, and a resistance of K×R between said first end and intermediate terminals thereof;

a current source coupled to said first terminal of said third transconductance cell, and providing the reference current signal that flows through said resistor string and that constitutes a portion of the first current signal; and a fourth transconductance cell having a first terminal, and a second terminal that is coupled to said first terminal of said fourth transconductance cell, said second input terminal of said amplifier of said controller and said second terminal of said second transconductance cell of said controller, said fourth transconductance cell having a voltage to current transfer function of N×T(·) from said first terminal thereof to said second terminal thereof.

6. The bias circuit of claim 4, wherein B=ΔIin, A=ΔIin×R, and said converter includes:

a third transconductance cell having a first terminal, and a second terminal that is coupled to said first input terminal of said amplifier of said controller and said second terminal of said first transconductance cell of said controller, said third transconductance cell having a voltage to current transfer function of T(·) from said first terminal thereof to said second terminal thereof;

a buffer having an input terminal that is coupled to said second terminal of said third transconductance cell, and an output terminal; a resistor string having a first end terminal that is coupled to said output terminal of said buffer, a second end terminal that is coupled to said first terminal of said third transconductance cell, and an intermediate terminal that provides the bias voltage, said resistor string having a resistance of R between said first and second end terminals thereof, and a resistance of K×R between said first end and intermediate terminals thereof;

a first current source coupled to said first terminal of said third transconductance cell, and providing the reference current signal that flows through said resistor string;

a fourth transconductance cell having a first terminal, and a second terminal that is coupled to said first terminal of said fourth transconductance cell, said second input terminal of said amplifier of said controller and said second terminal of said second transconductance cell of said controller, said fourth transconductance cell having a voltage to current transfer function of N×T(·) from said first terminal thereof to said second terminal thereof; and a second current source coupled to said second terminal of said fourth transconductance cell, and providing an auxiliary current that has a magnitude of N×ΔIin and that flows through said fourth transconductance cell.

7. The bias circuit of claim 4, wherein B=ΔIin, A=ΔIin×R, and said converter includes:

a third transconductance cell having a first terminal, and a second terminal that is coupled to said first terminal of said third transconductance cell and said second terminal of said first transconductance cell of said controller, said third transconductance cell having a voltage to current transfer function of T(·) from said first terminal thereof to said second terminal thereof;

a buffer having an input terminal that is coupled to said second terminal of said third transconductance cell, and an output terminal;

a resistor string having a first end terminal that is coupled to said first input terminal of said amplifier of said controller, a second end terminal that is coupled to said output terminal of said buffer, and an intermediate terminal that provides the bias voltage, said resistor string having a resistance of R between said first and second end terminals thereof, and a resistance of K×R between said first end and intermediate terminals thereof;

a first current source coupled to said first end terminal of said resistor string, and providing the reference current signal that flows through said resistor string;

a fourth transconductance cell having a first terminal, and a second terminal that is coupled to said first terminal of said fourth transconductance cell, said second input terminal of said amplifier of said controller and said second terminal of said second transconductance cell of said controller, said fourth transconductance cell having a voltage to current transfer function of N×T(·) from said first terminal thereof to said second terminal thereof; and a second current source coupled to said second terminal of said fourth transconductance cell, and providing an auxiliary current that has a magnitude of N×ΔIin and that flows through said fourth transconductance cell.

8. The bias circuit of claim 4, wherein B=0, A=0 and said converter includes:

a third transconductance cell having a first terminal, and a second terminal that is coupled to said first terminal of said third transconductance cell, said first input terminal of said amplifier of said controller and said second terminal of said first transconductance cell of said controller, said third transconductance cell having a voltage to current transfer function of T(·) from said first terminal thereof to said second terminal thereof;

a first current source coupled to said second terminal of said third transconductance cell, and providing an auxiliary current that has a magnitude of ΔIin and that constitutes a portion of the first current signal;

a fourth transconductance cell having a first terminal, and a second terminal that is coupled to said first terminal of said fourth transconductance cell and said second terminal of said second transconductance cell of said controller, said fourth transconductance cell having a voltage to current transfer function of N×T(·} from said first terminal thereof to said second terminal thereof;

a buffer having an input terminal that is coupled to said second terminal of said fourth transconductance cell, and an output terminal;

a resistor string having a first end terminal that is coupled to said second input terminal of said amplifier of said controller, a second end terminal that is coupled to said output terminal of said buffer, and an intermediate terminal that provides the bias voltage, said resistor string having a resistance of R between said first and second end terminals thereof, and a resistance of K×R between said first end and intermediate terminals thereof; and a second current source coupled to said first end terminal of said resistor string, and providing the reference current signal that flows through said resistor string.

9. The bias circuit of claim 4, wherein B=ΔIin, A=0 and said converter includes:

a third transconductance cell having a first terminal, and a second terminal that is coupled to said first terminal of said third transconductance cell, said first input terminal of said amplifier of said controller and said second terminal of said first transconductance cell of said controller, said third transconductance cell having a voltage to current transfer function of T(·) from said first terminal thereof to said second terminal thereof;

a fourth transconductance cell having a first terminal, and a second terminal that is coupled to said first terminal of said fourth transconductance cell and said second terminal of said second transconductance cell of said controller, said fourth transconductance cell having a voltage to current transfer function of N×T(·) from said first terminal thereof to said second terminal thereof;

a first current source coupled to said second terminal of said fourth transconductance cell, and providing an auxiliary current that has a magnitude of N×ΔIin and that flows through said fourth transconductance cell;

a buffer having an input terminal that is coupled to said second terminal of said fourth transconductance cell, and an output terminal;

a resistor string having a first end terminal that is coupled to said second input terminal of said amplifier of said controller, a second end terminal that is coupled to said output terminal of said buffer, and an intermediate terminal that provides the bias voltage, said resistor string having a resistance of R between said first and second end terminals thereof, and a resistance of K×R between said first end and intermediate terminals thereof; and a second current source coupled to said first end terminal of said resistor string, and providing the reference current signal that flows through said resistor string.

* * * * *